United States Patent [19]

Moriyama et al.

[11] Patent Number: 4,654,853
[45] Date of Patent: Mar. 31, 1987

[54] DATA TRANSMISSION METHOD

[75] Inventors: Yoshiaki Moriyama; Sumio Imoto, both of Saitama, Japan

[73] Assignee: Pioneer Electronic Corporation, Tokyo, Japan

[21] Appl. No.: 654,571

[22] Filed: Sep. 26, 1984

[30] Foreign Application Priority Data

Sep. 26, 1983 [JP] Japan .................. 58-178644

[51] Int. Cl.$^4$ .............................................. G06F 11/10
[52] U.S. Cl. .................................... 371/41; 371/37
[58] Field of Search ............................ 371/37, 41, 50

[56] References Cited

U.S. PATENT DOCUMENTS

| 3,078,443 | 2/1963 | Rose | 371/41 |
| 3,200,374 | 8/1965 | Ballard | 371/50 |
| 3,449,716 | 6/1969 | Brothman | 371/41 |
| 3,496,549 | 2/1970 | Tong | 371/41 |
| 3,657,700 | 4/1972 | Lutzker | 371/37 |
| 4,110,558 | 8/1978 | Kageyama | 371/41 |

FOREIGN PATENT DOCUMENTS

1456846 11/1976 United Kingdom .................. 371/41

Primary Examiner—Jerry Smith
Assistant Examiner—Robert W. Beausoliel, Jr.
Attorney, Agent, or Firm—Sughrue, Mion, Zinn, Macpeak, and Seas

[57] ABSTRACT

A data transmission method in which data of different types is transmitted and errors detected and corrected optimally for the particular type of data transmitted. A check word is inserted into each group of a plurality of data groups, and a control code is also provided representing the coding method on which the check word is based. The data groups including the check word are transmitted together with the control code. At the receiving end, the control code is separated from the transmitted signal and used to detect the coding method on which the check word is based. Then, error detection and error correction are performed in accordance with the detected coding method.

14 Claims, 15 Drawing Figures

FIG. 9A
LEVEL 0

FIG. 9B
LEVEL 1

FIG. 9C
LEVEL 2

FIG. 9D
LEVEL 3

DATA TRANSMISSION METHOD

BACKGROUND OF THE INVENTION

The present invention relates to a data transmission method for transmitting (including recording and reproducing) digital signals representing audio information or the like.

Figures 1, 2:
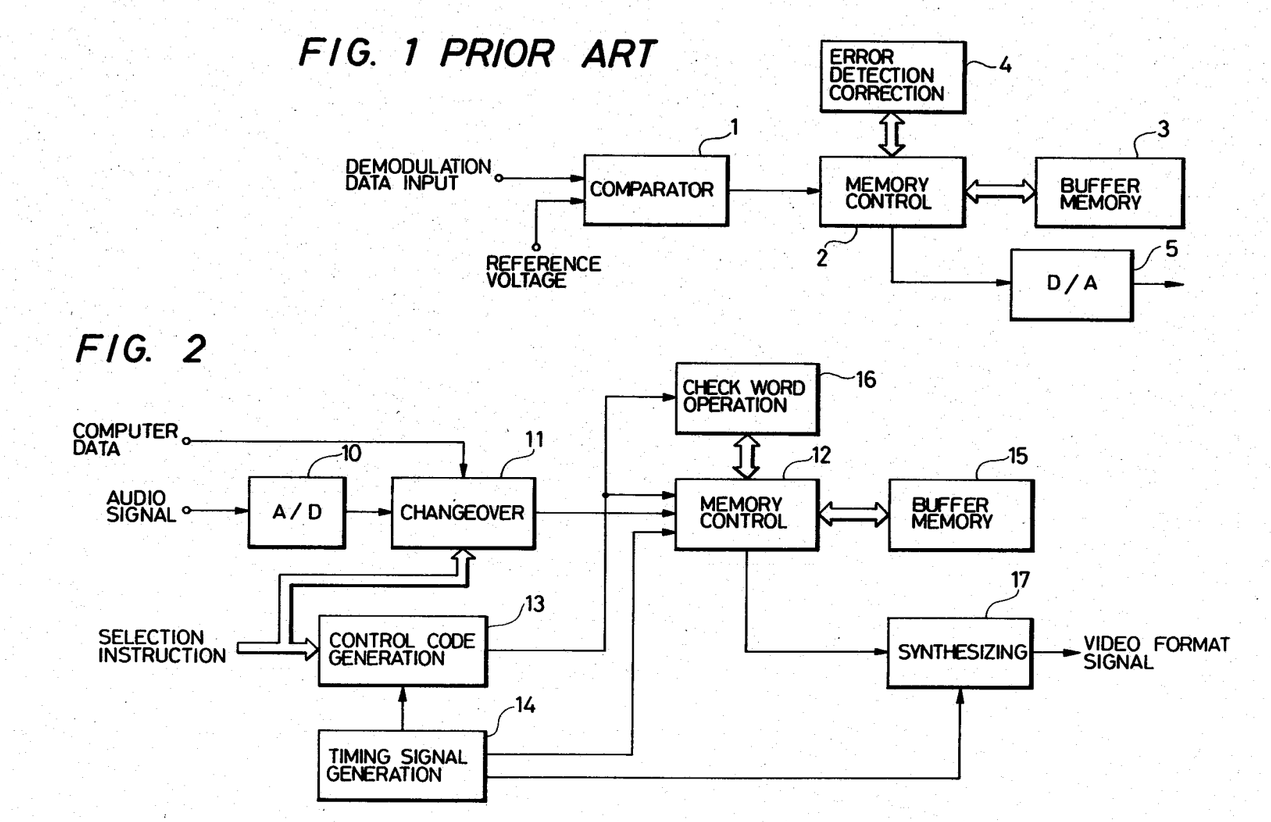
FIG. 1 is a block diagram showing a conventional received data signal processing circuit.
FIG. 2 is a block diagram showing a transmission data processing circuit of a data transmission system according to the present invention.

Conventionally, a reproducing apparatus as shown in FIG. 1 has been used at a reception side of a data transmission system of this type. In FIG. 1, a data input carrying, for example, audio information transmitted and demodulated by a suitable demodulator is compared with a reference voltage by a comparator 1, shaped into a digital signal having steep leading and trailing edges, and then supplied to a memory control circuit 2. Employing synchronization derived from a clock component extracted from the supplied digital signal, the memory control circuit 2 successively writes the information data and check word (parity bit) in the digital signal into a buffer memory 3. Upon completion of the writing operation, the data is successively read out of the buffer memory 3 and supplied to an error detection correction circuit 4 where, if there is an error bit in the information data, the location of the error bit is detected and the error corrected. The thus-corrected data is successively read out and converted into the original audio signal by a D/A converter 5. In the data reproducing apparatus as described above, the coding method in which the check word added at the transmitter side is based is fixed, and error detection correction operations are performed corresponding to the coding method.

In such a data transmission system, in the case where a single type of information is to be transmitted, it is sufficient to employ a coding method having necessary redundancy and capability of error correction in accordance with the type of the information, and therefore there are no particular problems. However, where a plurality of types of information, for example, such as audio information having a relatively high self correlation and computer program information having a low self correlation, are to be transmitted, the coding method should be different for the two different types of data. For instance, in the case of transmitting by way of the same tranceiver both computer programs and audio signals digitized by an ADM (Adaptive Delta Modulation) system, the coding method is chosen such that the probability of data error correction for the computer programs is acceptably high, the coding method becomes nonoptimum when applied to the audio signals because the data correction is performed with an unnecessarily high quality.

SUMMARY OF THE INVENTION

The present invention has been attained in view of the above-mentioned circumstances. Specifically, an object of the present invention is to provide a data transmission method in which it is possible to transmit data carrying various kinds of information more efficiently and correctly by way of a single transmitting/receiving apparatus.

In the data transmission method according to the present invention, at the transmission side, an optimum coding method on which a data group including information data and a check word is based is selected in accordance with the contents or type of the information carried thereby, and a control code representing the thus-selected coding method is inserted into a data signal. At the reception side, the control code inserted in the data signal is extracted so as to determine the coding method on which the data group is based, and the data group is subjected to error detection/correction processing on the basis of the determined coding method to thereby recover the original information from the data group after error correction.

DESCRIPTION OF THE PREFERRED EMBODIMENTS

Referring to FIGS. 2 to 9, a data transmission system according to the present invention will be described in detail hereunder.

FIG. 2 shows a transmitter apparatus embodying a data transmission system according to the present invention, which is supplied with an audio signal or computer data as an input signal thereto, the audio signal being digitized by, for example, an A/D converter 10 in accordance with the ADM system. The thus-obtained audio information data and the computer data are supplied to a changeover circuit 11 and the changeover circuit 11 supplies the computer data or the audio information data to a memory control circuit 12 in accordance with a selection instruction. The selection instruction is supplied also to a control code generating circuit 13 which in turn generates a control code in synchronism with a timing signal from a timing-signal generating circuit 14. The control code may be produced, for example, in the form of a two-bit binary code.

Figure 3:
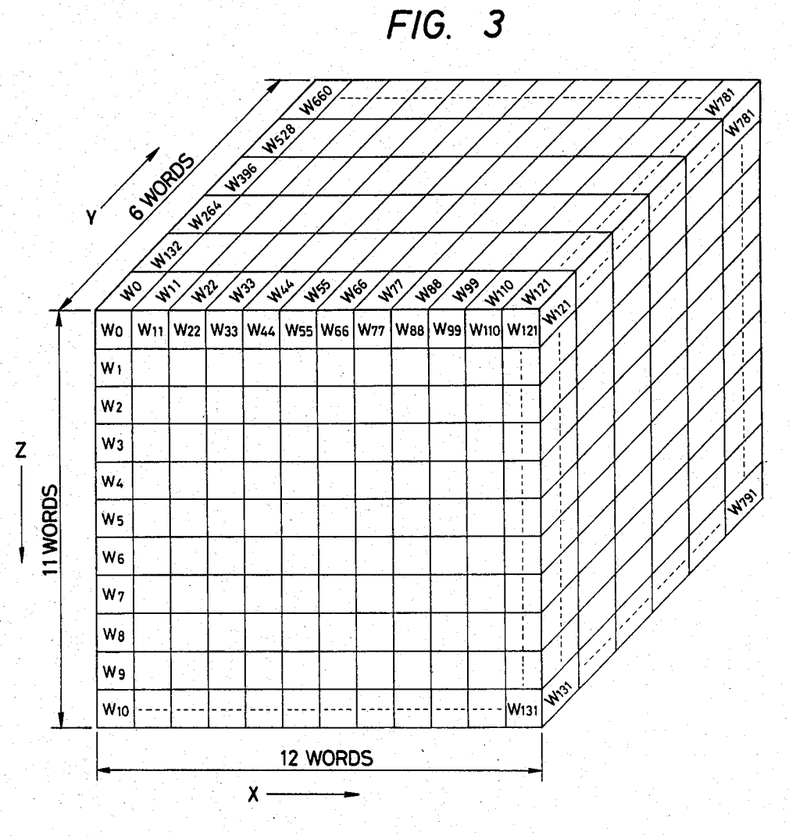
FIG. 3 is a diagram showing an example of an information data arrangement in the data transmission system according to the present invention.

The memory control circuit 12 successively transfers the data supplied thereto to a buffer memory 15 to cause the buffer memory 15 to store the data therein, and the memory control circuit 12 reads the stored data out of the buffer memory 15 and supplies it to a check word operation circuit 16. The check word operation circuit 16 produces a check word in accordance with the coding method corresponding to the control code supplied by the control code generating circuit 13, and the check word operation circuit 16 cooperates with the memory control circuit 12 to store the check word at a proper address in the buffer memory 15 so that a desired data arrangement containing the check word is formed in the buffer memory 15. The information data arrangement formed in the buffer memory 15 may be, for example, a three-dimensional arrangement (hereinafter referred to as an information block) in which information data is composed of twelve words in the X direction, six words in the Y direction and eleven words in the Z direction, as illustrated in FIG. 3.

Figure 4:
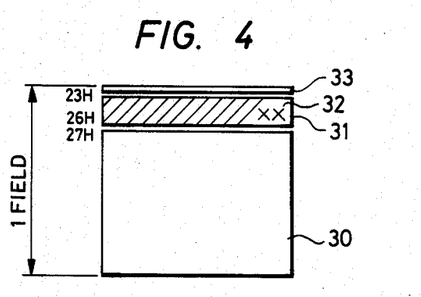
FIG. 4. is a diagram showing a signal pattern when a video format signal is formed in the data transmission system according to the present invention.

In this case, a control code is constituted by a two-bit binary code so that four different control codes, "00", "01", "10" and "11" are obtained, and four coding methods corresponding to the respective two-bit binary codes are made to respectively correspond to four error correction capability levels, that is, "level 0", "level 1", "level 2" and "level 3". Error correction processing is performed for each data group including a check word for error detection, hereinafter referred to as "a code block". In the case of transmitting a code block as a video format signal, the video format signal is arranged within the area 30 following the twenty-seventh horizontal scanning period. In each field, as shown in FIG. 4, although control data for the hardware at the reproducing side and instruction data designating control for the reproducing mode of a picture and an audio signal may be included in the area 31 from the twenty-third horizontal line to the twenty-sixth horizontal line, the control code 32 representing the two-bit coding method is inserted in a portion of the area 31.

Figures 5A, 5B, 5C, 5D:
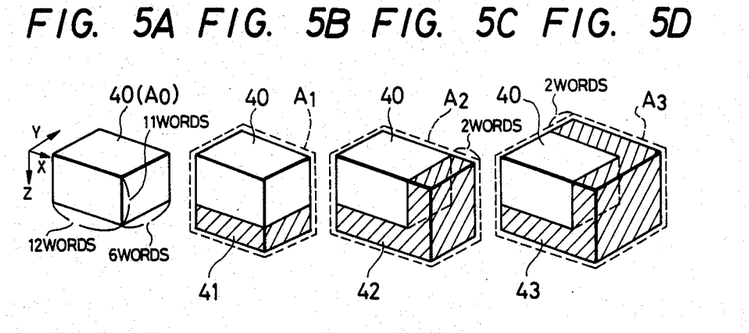
FIGS. 5A to 5D are diagrams showing examples of data arrangements used in the data transmission system according to the present invention.

A code block is formed by adding a redundancy bit, that is a check word, in one, two or all of the three, X, Y, and Z directions of an information block. This state is shown in FIGS. 5A to 5D. FIG. 5A shows the case of a single information block 40 ($A_0$), FIG. 5B shows a code block $A_1$ in which a group of check words 41, each constituted by two words, is added to the information block 40 only in the Z direction, FIG. 5C shows a code block $A_2$ in which a group of check words 42 is added in the X and Z directions, and FIG. 5D shows a code block $A_3$ in which a group of check words 43 are added in the X, Y and Z directions. Referring to an information block having no check word as a code block $A_0$, the code blocks $A_0$ to $A_3$ correspond to the respective error detection capability levels 0, 1, 2 and 3, and the above-mentioned control codes "00", "01", "10" and "11" correspond to the code blocks $A_0$ to $A_3$ to represent the same.

After forming such a code block $A_0$, $A_1$, $A_2$ or $A_3$ as described above in the buffer memory 15 in accordance with a control code, control data and code block data produced as a one-dimensional arrangement from the memory control circuit 12 in accordance with a predetermined readout order in response to a timing signal are mixed with various timing signals such as a vertical and a horizontal synchronizing signal, a blanking signal, etc., in a synthesizing circuit 17 to form a video format signal which is then transmitted or recorded after it has been subjected to modulation.

Figure 6:
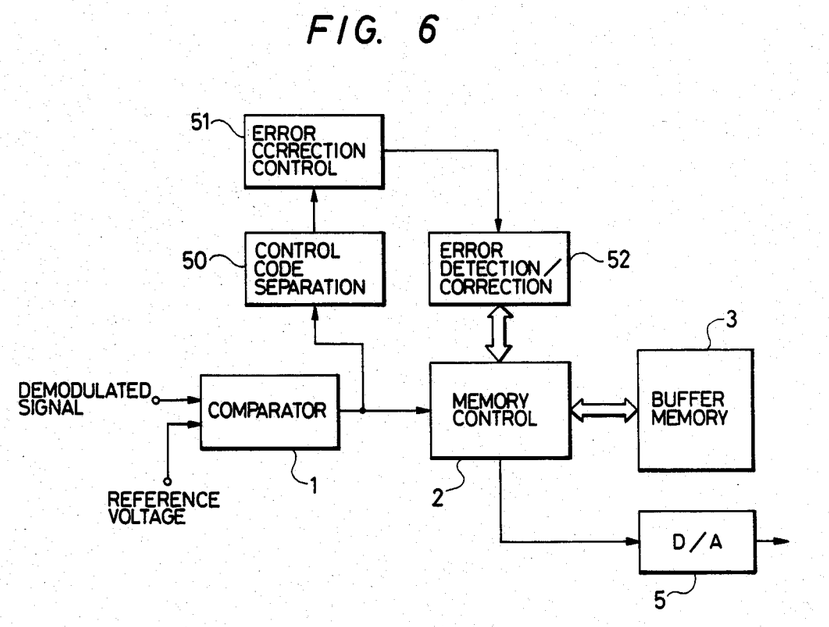
FIG. 6 is a block diagram showing the received data signal processing circuit in the data transmission system according to the present invention.

The thus-transmitted or recorded video format signal or data signal is reproduced by a reproducing apparatus as shown in FIG. 6. A video format signal or a data signal, which is received or read from a recording medium, is demodulated, supplied to a comparator 1 to be shaped into a digital signal having a waveform with steep leading and trailing edges, supplied to a memory control circuit, and then succesively stored in a buffer memory 3 in the same manner as in the prior art. However, the digital signal obtained from the comparator 1 is supplied also to a control code separation circuit 50. A control code separated and extracted in the control code separation circuit 50 is supplied to an error correction control circuit 51, which in turn supplies a correction level indicating signal to an error detection/correction circuit 52 in accordance with the control code. The error detection/correction circuit 52 achieves an error detection/correction operation in accordance with the correction level indicating signal. Thus, an error detection/correction operation is performed corresponding to the coding method at the transmission side so that the error detection/correction operation is performed efficiently. The error-corrected data is successively read out of the buffer 3 and outputted directly in the case of computer data or D/A converted in the case of audio data or the like.

Figure 7:
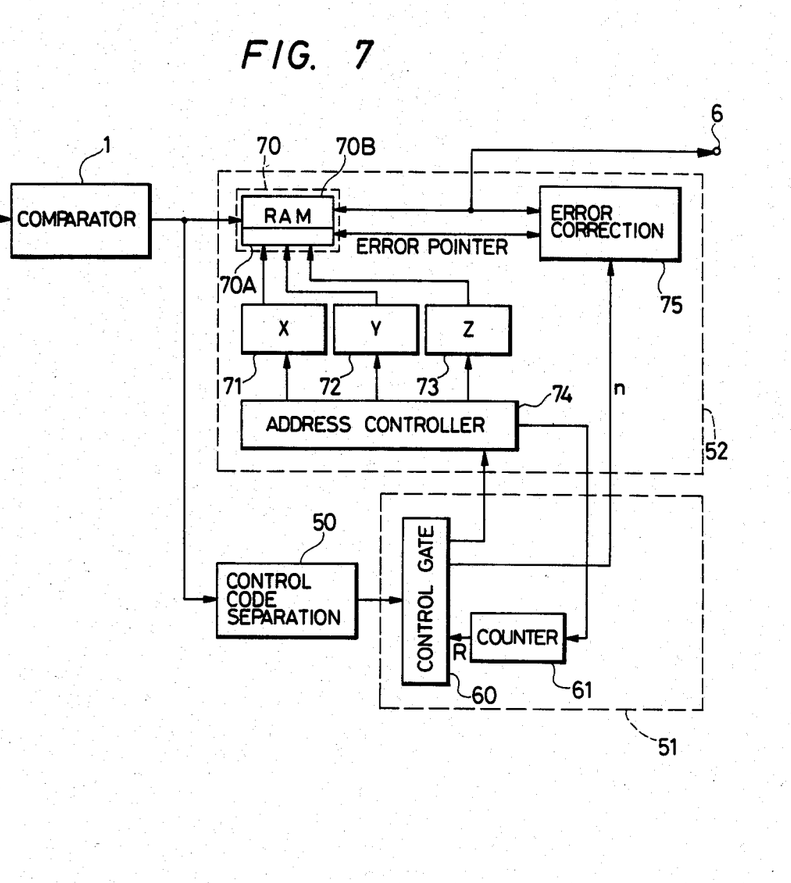
FIG. 7 is a block diagram showing a part of FIG. 6.

FIG. 7 shows an embodiment of the error correction control circuit 51 and the error detection/correction circuit 52 of FIG. 6. In FIG. 7, reference numeral 60 designates an error correction control gate which is connected with the output of the control code separation circuit 50 and the output of a read number counter 61 and which produces an output to an address controller 74 and a Reed-Solomon code error correction circuit 75. The read-out number counter 61, connected with one output of the address controller 74, produces an output to the error correction control gate 60. Reference numeral 70 designates a small capacity RAM for error correction, including an error pointer memory 70A and a data memory 70B. The address of the RAM 70 is assigned by an X address counter 71, a Y address counter 72 and a Z address counter 73. An enabling signal for each address counter is produced by an address controller 74 which is connected with one output of the error control gate 60 and which has outputs connected to the X address counter 71, the Y address counter 72, the Z address counter 73 and the readout number counter 61. Reference numeral 75 designates a Reed-Solomon code error correction circuit which is controlled by one of the outputs of the error control gate 60 and which exchanges data and error pointers with the small capacity RAM. The error correction control gate 60 and the correction number counter 61 shown in FIG. 7 are included in the error correction control circuit 51 of FIG. 6, and the small capacity RAM 70, the X address counter 71, the Y address counter 72, the Z address counter 73, the address controller 74 and the Reed-Solomon error correction circuit 75 are included in the error detection/correction circuit 52, the operational one of which can be selected.

The operation at the reproducing side will be described more in detail. The code block $A_1$ shown in FIG. 5B has two check words only in one direction (hereinafter this error correction is referred to as "error correction at level 1", and more briefly referred to as "level 1"), and is mainly used for ADM audio data or the like. FIG. 5C shows the case of two check words in each of two directions (hereinafter this error correction is referred to as "error correction at level 2", and more briefly referred to as "level 2"), in which the correction capability is higher than that of level 1 and which is used for character information data or the like. FIG. 5D illustrates the case of two check words in each of three directions (hereinafter this error correction is referred to as "error correction at level 3", and more briefly referred to as "level 3"), which is used, for example, for computer programs or the like, that is, mainly in the case where a higher correction capability is required than for level 2 and which is suitable for computer programs and the like. In this case, one row in each direction in which the check words are added is regarded as one code word in the error correction code. The case where no check word is added in any direction as shown in FIG. 5A is hereinafter referred to as "error correction at level 0", and more briefly referred to as "level 0". The "level 0" is mainly used for the case where data is outputted without correcting errors.

As described above, "level 0", "level 1", "level 2", and "level 3" are selected by the coding selection control codes "00", "01", "10" and "11". Assuming the number of words including the check word in each direction in each error correction is represented by (x, y, z), it is further assumed that (x, y, z)=(12, 6, 13) at level 1, (x, y, z)=(14, 6, 13) at level 2, and (x, y, z)=(14, 8, 13) at level 3. Further, assuming that the redundancy is defined as Redundancy=(number of check words/total number of words)×100%, the redundancy is about 15% at level 1, about 30% at level 2, and about 45% at level 3. It is thus apparent that the redundancy increases in the order from level 1 to level 3 while the correction capability increases in the same order. In this example, assuming that all the error detection and error correction are effected by an eight-bit word unit in a Reed-Solomon code format on a Galois field $GF(2^8)$, the respective primitive element $\alpha$ is a root of a polynominal $P(m)=m^8+m^4+m^3+m^2+1$ and is represented in eight bits as $\alpha=(00000010)$. Further, a check matrix H for syndrome checking is expressed by:

$$H = \begin{bmatrix} 1 & 1 & \ldots & 1 & 1 \\ \alpha^{n-1} & \alpha^{n-2} & \ldots & \alpha & 1 \end{bmatrix},$$

where n represents the code length. This matrix H is used for syndrome calculation, which will be described later. This matrix is expressed as follows using a matrix T for each bit:

$$H = \begin{bmatrix} I & I & \ldots & I & I \\ T^{n-1} & T^{n-2} & \ldots & T & I \end{bmatrix},$$

where I is a unit matrix of eight-rows and eight-columns and T is a matrix of eight rows and eight columns as follows:

$$T = \begin{bmatrix} 01000000 \\ 00100000 \\ 00010000 \\ 10000000 \\ 10000100 \\ 10000010 \\ 10000001 \\ 10000000 \end{bmatrix}$$

To detect the error position or the error contents, a syndrome S which is defined as follows is obtained:

$$S=[S_P, S_Q]^t = H \cdot [W_{n-1} W_{n-2} \ldots W_2 P Q]^t,$$

where $W_{n-1}, W_{n-2} \ldots, W_2$ represent words of information and it is assumed that the words are arranged in the descending order of the suffices of the coded words. P and Q represent a check word composed of two words determined so as to satisfy the equation $S_P=S_Q=0$. It is stored together with information words.

At the reproducing side, the equation $S_P=S_Q=0$ is satisfied if there is no error in the reproduced data. In other cases, it is possible to determine the error pattern or error position from the respective values of $S_P$ and $S_Q$. On the basis of the above-mentioned equation for S and the definition of the check matrix H, the respective values of $S_P$ and $S_Q$ are expressed as follows:

$$S_P = \sum_i W_i \oplus P \oplus Q, \text{ and}$$

$$S_Q = \sum_i \alpha^i W_i \oplus P \oplus Q,$$

where $i=n-1, n-2, \ldots, 2$;

$$\sum_i$$

represents the total sum by exclusive ORing, and $\oplus$ designates an exclusive-OR operation. In the case where an information word has an error pattern $e_i$, the information word $W_i'$ including an error is expressed by:

$$W_i' = W_i \oplus e_i,$$

and if this value is substituted into $W_i$ in the above-mentioned equations for $S_P$ and $S_Q$, the following equations are obtained:

$$S_P = \sum_i e_i, \text{ and}$$

$$S_P = \sum_i \alpha^i e_i.$$

Assuming now that $W_L'$ represents an information word $W_L$ ($2 \leq L \leq n-1$) when an error occurs therein, the following equations are obtained:

$$S_P = \sum_i e_i = e_L, \text{ and}$$

$$S_p = \sum_i \alpha^i e_i = \alpha^L e_L.$$

Thus, an error pattern $e_L$ can be obtained from the value of $S_P$. Further, an equation $S_P = \alpha^{-L} S_Q$ can be derived from the above equations and an error position can be obtained on the basis of this equation. The error correction is achieved on the basis of the following equation:

$$W_L' \oplus e_L = (W_L \oplus e_L) \oplus e_L = W_L.$$

That is, the error correction is performed by exclusively ORing the error word $W_L'$ and the error pattern $e_L$. Such error correction, which is achieved by using only the syndrome S (that is, $[S_P, S_Q]^t$), is hereinafter referred to as "syndrome correction".

It is possible to perform error correction for one word using this syndrome correction. In the case where errors are included in two words, to the contrary, error detection is performed by effecting syndrome calculation in one direction, for example, in the X direction, (that is no error correction is performed), to thereby obtain an error position (that is by using the error pointer) to calculate syndromes in the Y or Z direction, and then error correction is performed on the basis of the relation as described under. This correction is referred to as "erasure correction". Description will be made hereunder as to the case where errors occur in two words such that the information word $W_h$ ($2 \leq h \leq n-1$) is erroneously changed into $W'_h$ by an error pattern $e_h$ and the information word $W_j$ ($2 \leq j \leq n-1$) is changed into $W'_j$ by an error pattern $e_j$. As described above, $$S_P = \sum_i e_i = e_h \oplus e_j, \text{ and}$$

$$S_Q = \sum_i \alpha^i e_i = \alpha^h e_h \oplus \alpha^j e_j,$$

and therefore:

$$e_h = \frac{\alpha^j S_P \oplus S_Q}{\alpha^h \oplus \alpha^j},$$

$$e_j = \frac{\alpha^h S_P \oplus S_Q}{\alpha^h \oplus \alpha^j},$$

so that the error positions h and j already found by means of the error pointer and $e_h$ and $e_j$ can be obtained from $S_P$ and $S_Q$ obtained from the above equations. Accordingly, error words $W_h'$ and $W_j'$ can be corrected into the correct original words $W_h$ and $W_j$ as follows:

$$W_h' \oplus e_h = (W_h \oplus e_h) \oplus e_h = W_h, \text{ and}$$

$$W_j' \oplus e_j = (W_j \oplus e_j) \oplus e_j = W_j.$$

The processing in this manner is performed such that one-word syndrome correction only in the Z direction is achieved in "level 1", error detection is effected in the X direction to provide error pointers by which two-word erasure in the Z direction and one-word syndrome correction in the Z direction are performed in level 2, and error detection is performed in the X direction and two-word erasure correction and one-word syndrome correction are effected in the Y and Z directions, respectively, in level 3.

The operation of the apparatus shown in FIG. 7 will now be described hereunder. The buffer memory 3 in FIG. 6 has a large capacity sufficient for storing a plurality of code blocks and control codes. The data is transferred from the memory 3 by one code block through the terminal 6 to the small capacity RAM 70 to be temporarily stored therein, and thereafter corrected in the Reed-Solomon code error correction circuit 75.

The control for reading out the data from the small capacity RAM 70 to the Reed-Solomon code error correction circuit 75 is performed as follows: The control code separation circuit 50 produces one of the control codes "00", "01", "10" or "11" corresponding to the correction level. Referring to the control code and the output signal R of the read-out number counter 61, the error correction control gate 60 transmits a direction changeover signal for error detection/correction in the X, Y and Z directions to the address controller 74, and at the same time transmits a changeover signal for the code length n in each direction to the Reed-Solomon code correction circuit 75. The read-out number counter 61 is such a counter in which one is added every time the address count has reached the last word of the code block in error detection/error correction in each of the X, Y and Z directions. In this circuit, the maximum value of the output R of the counter 61 is obtained at the level 3 and is set to two. The output R is reset to zero by a timing signal derived from the data prior to the start of code block error correction (including error detection). Upon reception of a direction changeover signal for error detection/correction, the address controller 74 determines the sequence of operations of the X direction address counter 71, the Y direction address counter 72 and the Z direction address counter 73 and enables the respective counters in accordance with the determined operating sequence. For instance, for error detection in the X direction (X detection), the address is advanced in the order of the X address, Y addess and Z address; in the case of error correction in the Y direction (Y correction), the address is advanced in the order of the Y address, Z address and X address; and in the case of error correction in the Z direction (Z correction), the address is advanced in the order of the Z address, X address and Y address. The correspondence among the X detection, Y correction, Z correction, the correction levels, and the output signal R of the read-out number counter 61 is as shown in the columns labelled "Correction Level" and "Operations" in the Table below. At level zero, neither error detection nor error correction is conducted when R=0; at level 1, Z correction is conducted when R=0; at level 2, X detection and Z correction are conducted when R=0 and R=1, respectively; at level 3, X detection, Y correction, and Z correction are conducted when R=0, R=1 and R=2, respectively. The data corresponding to the addresses of the small capacity RAM 70 designated by the three counters 71, 72 and 73 is read out and supplied to the Reed-Solomon code correction circuit 75. In the Reed-Solomon code correction circuit 75, at level 1, since X detection is not conducted and no error pointer can be found, syndrome correction is conducted and only the corrected data is written again in the data memory 70B in the small capacity RAM 70. At level 2 and level 3, the error detection is made for every code word in the X direction to establish an error pointer corresponding to every code word, and the thus-established error pointer is written in the error pointer memory 70A in the small capacity RAM 70. Thereafter, the error pointer is read out of the small capacity RAM 70 together with the data into the Reed-Solomon code correction circuit 75 in which data correction is performed in the Y or Z direction on the basis of the error pointer. The corrected data is written again into the data memory 70B in the small capacity RAM 70. Upon completion of error correction, the code blocks are transferred from the data memory 70B to the terminal 6.

Figure 8:
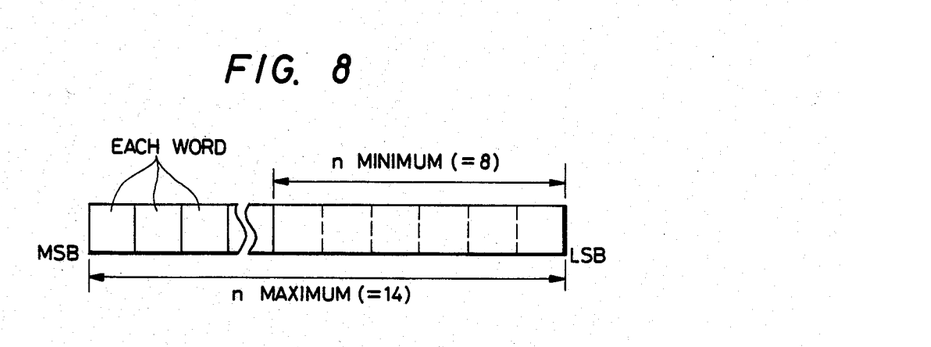
FIG. 8 is a diagram showing an example of the code length in the data transmission system according to the present invention.
Figure 9A:
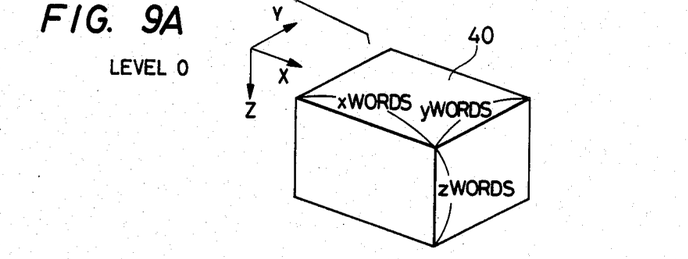
FIGS. 9A to 9D show examples of other data arrangements which can be used in the data transmission system according to the present invention.
Figure 9B:
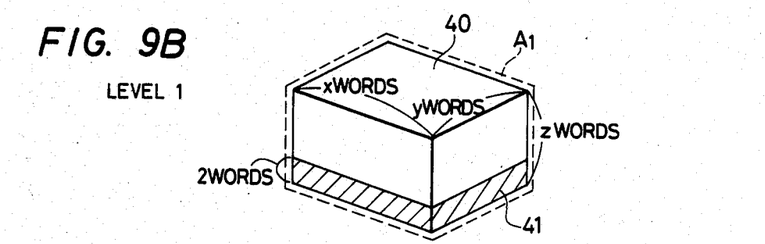
Figure 9C:
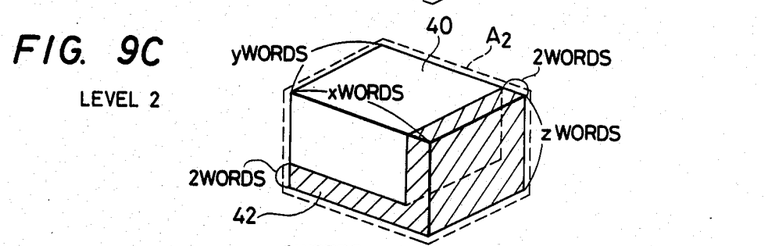
Figure 9D:
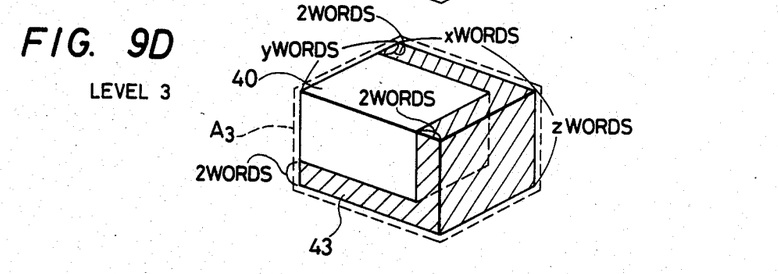

If the Reed-Solomon code error correction circuit 75 is arranged such that a code word having a maximum code length as shown in FIG. 8 (for example, the code length n=14 in the X direction in this embodiment) can be processed, it is of course a code word having a code length smaller than the maximum code length that can be processed therein. Accordingly, error detection/correction in each of the X, Y and Z directions is performed by assigning the value of n. In the case of the minimum code length as shown in the same drawing (for example, the code length n=8 in the Y-direction in this embodiment), a normal error correcting operation can be performed without modifying the correction circuit 75 at all by performing code word processing by substituting zero into the remainder words (for example, six words in this embodiment). A changeover signal for use in assigning the code length n is obtained from the error correction control gate 60 as described above, and the code length n in each of the X, Y and Z directions at each correction level is such that n=13 in the Z direction at level 1; n=14 in the X direction and n=13 in the Z direction at level 1; and n=14 in the X direction, n=8 in the Y direction and n=13 in the Z direction at level 3; as shown in the Table, except the case at level 0.

TABLE

| CONTROL CODE | CORRECTION LEVEL | OPERATIONS | | | CODE LENGTH (n) |
|---|---|---|---|---|---|
| 11 | LEVEL 3 | R=0 | R=1 | R=2 | X dir. n=14 |
|  |  | X det.→Y Corr.→Z Corr. | | | Y dir. n=8 |
|  |  |  | | | Z dir. n=13 |
| 10 | LEVEL 2 | R=0 | R=1 | | X dir. n=14 |
|  |  | X det.→Z Corr. | | | Z dir. n=13 |
| 01 | LEVEL 1 | R=0 | | | Z dir. n=13 |
|  |  | Z corr. | | | |
| 00 | LEVEL 0 | R=0 | | | |
|  |  | Neither detection nor correction is performed. | | | |

NOTE:
R represents the output signal of the read-out number counter.

In the described embodiment, description has been made regarding the case of a data group coding method in which check words are added to an information block of a fixed size as shown in FIGS. 3 and 5 so that a code block is changed in size. However, such a coding method as shown in FIG. 9 may be employed in which the size (X, Y, Z) of a code block is fixed and check words are added in accordance with the error correction level so that an information block is varied in size with the same effect as in the previously described embodiment.

In the described preferred embodiment, although two check words are employed in each direction, the number of these check words is not restricted to two, but the same applies to other cases with the same effect.

In the above embodiment, although description has been made as to the case where a video signal was partly replaced by digital data and transmitted as a video format signal, it is apparent that the present transmission system can be applied to other cases of ordinary data transmission.

As described above, according to the present invention, the system is arranged such that the operation of an error correction circuit is automatically changed over by a control code included in a control data region in accordance with a correction level required for digital data so that optimization of the redundancy and correction capability in the error correction is attained. That is, it is possible to select a coding method suitable for computer programs, character information data, audio data or the like so that various operations can be continuously and automatically performed such that, for example, the correction capability may be increased for computer programs by setting the redundancy to a large value, while in the case of audio data, a low correction level may be applied to reduce the redundancy as much as possible by applying to make it possible to extend the audio reproduction period. Further, the error correction circuit is arranged such that a conventional Reed-Solomon code error correction circuit can be commonly used at various correction levels without extensive modifications or increased costs merely by adding peripheral circuits.

We claim:

1. A data transmission method comprising the steps of: inserting check words in selected positions in each of plural information blocks to form code blocks; providing for each code block a control code representing a coding method on which the check words and their position in the code block are based; transmitting each of said code blocks together with its corresponding control code; separating said control code from the transmitted code block to detect said coding method on which said check words and their positions are based; and performing error detection and error correction on the code block using the check words and data in the corresponding information block in accordance with detected coding method.

2. The data transmission method according to claim 1, wherein said data in each of said code blocks is three dimensionally arranged in a three dimensional space defined by three directions, X, Y and Z, and wherein a check word is added at least in one of said directions X, Y, and Z.

3. The data transmission method as claimed in claim 2 wherein the size of said code blocks is fixed and said information blocks vary in size in accordance with the selected coding method.

4. The data transmission method as claimed in claim 2 wherein the size of said information blocks is fixed and said code blocks vary in size in accordance with the selected coding method.

5. A data transmission method comprising the steps of:
(a) receiving any of plural types of input signals;
(b) for each received input signal determining a coding method from serval given coding methods;
(c) assigining a unique control code corresponding to a respective coding method to each received input signal according to the determined coding method for the received input signal;
(d) coding the input signal according to its determined coding method to form a code block consisting of an information data block and check words; and
(e) transmitting the code block with the corresponding control code.

6. A data transmission method as claimed in claim 5 wherein said information data block is formed into a three dimensional arrangement consisting of a plurality of word rows in each of the X, Y and Z directions, and said step of coding said input signal according to one of said given coding methods consists of adding check words into the word rows in at least one of said X, Y and Z directions according to the determined coding method.

7. A data transmission method as claimed in claim 6 wherein said coding step includes adding a group of check words to each of the word rows in at least one of said X, Y and Z directions according to the determined coding method.

8. A data transmission method as claimed in claim 7 wherein said group of check words comprises a pair of check words.

9. A data transmission method as claimed in claim 7 wherein said coding step comprises adding groups of check words to only the word rows in the X direction.

10. A data transmission method as claimed in claim 7 wherein said coding step comprises adding groups of check words to only the word rows in the X and Z directions.

11. A data transmission method as claimed in claim 7 wherein said coding step comprises adding group of check words to only the word rows in the Z and Y directions.

12. A data transmission method as claimed in claim 6 wherein the size of said code blocks is fixed and said information blocks vary in size in accordance with the selected coding method.

13. A data transmission method as claimed in claim 6 wherein the size of said inforamtion blocks is fixed and said code blocks vary in size according to the selected coding method.

14. A data transmission and reception method comprising the steps of:
(A) at a transmission side;
 (a) receiving any of a plurality of different types of input signals;
 (b) for each received input signal determining a coding method from several given coding methods;
 (c) assigning a unique control code corresponding to a respective coding method to each received input signal according to the determined coding method for the received input signal;
 (d) coding the input signal according to its determined coding method to form a code block consisting of an information data block and check words, and
 (e) transmitting the code block with the corresponding control code to a reception side; and
(B) at the reception side;
 (a) separating the received control code from its corresponding code block;
 (b) generating a correction level indicating signal in response to the separated control code; and
 (c) performing error correction on the received code block in accordance with the coding method designated by the correction level indicating level.

* * * * *